(12) United States Patent
Xie et al.

(10) Patent No.: US 6,526,551 B2
(45) Date of Patent: Feb. 25, 2003

(54) FORMAL VERIFICATION OF A LOGIC DESIGN THROUGH IMPLICIT ENUMERATION OF STRONGLY CONNECTED COMPONENTS

(75) Inventors: Aiguo Xie, Alhambra, CA (US); Peter A. Beerel, Westminster, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 09/894,769

(22) Filed: Jun. 28, 2001

(65) Prior Publication Data

US 2002/0013934 A1 Jan. 31, 2002

Related U.S. Application Data

(60) Provisional application No. 60/215,407, filed on Jun. 30, 2000.

(51) Int. Cl.⁷ .............................. G06F 9/45; G06F 17/50
(52) U.S. Cl. .................... 716/5; 716/4; 716/7; 716/8
(58) Field of Search ............................. 716/5, 4, 7, 6, 716/18

(56) References Cited

U.S. PATENT DOCUMENTS

5,731,983 A  *  3/1998  Balakrishnan et al. ......... 716/18
5,978,588 A      11/1999 Wallace ....................... 395/709

OTHER PUBLICATIONS

Xie, A., et al., "Implicit Enumeration of Strongly Connected Components and an Application to Formal Verification," *Proc. Of the International Conference on Computer Aided Verification*, Nov., 1999.

Aho, A., et al., *The Design and Analysis of Computer Algorithms*, Addison–Wesley Publishing Co., 1974.

Singhal, V., "Design Replacements for Sequential Circuits," PhD Thesis, University of California at Berkeley, 1996.

Hasteer, G., et al., "An Implicit Algorithm for Finding Steady States and its Application to FSM Verification," *Proceedings of the ACM/IEEE Design Automation Conference*, pp. 611–614, 1998.

Bryant, R., "Graph–Based Algorithms for Boolean Function Manipulation," *IEEE Transactions on Computers*, vol. C35 No. 8, Aug. 1996.

Hardin, R. et al., "A New Heuristic for Bad Cycle Detection Using BDDs," *Proceedings of the International Workshop on Computer Aided Verification*, pp. 268–278, 1974.

Burch, J., et al., "Symbolic Model Checking for Sequential Circuit Verification," *IEEE Transactions on Computer–Aided Design of Integrated Circuits and Systems*, vol. 13, No. 4, pp. 401–424, Apr. 1994.

Hachtel, G., et al., "Markovian Analysis of Large Finite State Machines," *IEEE Transactions on Computer–Aided Design of Integrated Circuits and Systems,* vol. 15, No. 12, pp. 1479–1493, Dec. 1996.

(List continued on next page.)

*Primary Examiner*—Tuan T. Lam
(74) *Attorney, Agent, or Firm*—Moore & Van Allen PLLC; Steven B. Phillips

(57) ABSTRACT

Formal verification of a logic design through implicit enumeration of strongly connected components. The invention provides for efficient, cost-effective formal verification of logical circuits and systems using a method that is much less computationally expensive than other known methods. A digraph is recursively decomposed using reachability analysis. Non-trivial, strongly connected components derived through the use of the invention can be compared to expected behavior of a circuit or system. Alternatively, the invention can be applied to detect so-called "bad cycles" which are encountered in many formal verification problems.

35 Claims, 10 Drawing Sheets

OTHER PUBLICATIONS

Qadeer, S., et al., "Latch Redundancy Removal Without Global Reset," *Proceedings of the International Conference on Computer Design (ICCD)*, Oct., 1996.

Xie, A., et al., "Efficient State Classification of Finite–State Markov Chains," *IEEE Transactions on Computer–Aided Design of Integrated Circuits and Systems,* vol. 17., No. 12, pp. 1334–1339, Dec. 1998.

Brayton, R., et al., "VIS: A System for Verification and Synthesis," *Proceedings of the International Conference on Computer Aided Verification,* pp. 428–432, 1996.

\* cited by examiner

| state bits | | | state labels |
|---|---|---|---|
| s[0] | s[1] | s[2] | |
| 0 | 0 | 0 | 1 |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | 7 |
| 1 | 1 | 1 | 8 |

FIG. 3A      FIG. 3B      FIG. 3C
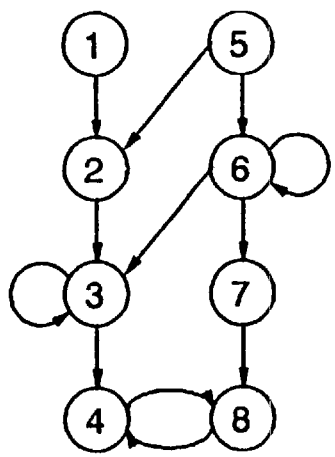 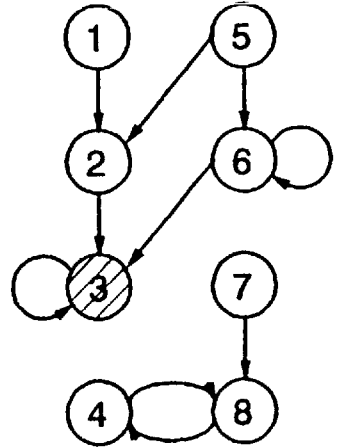 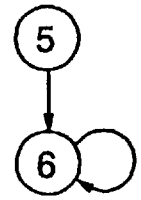
FIG. 4
SCC_DECOMP $(N,V)$
$V' \leftarrow V;$
while( $V' \neq 0$ ) {
$v \leftarrow$ random_take( $V'$ );
$B(v) \leftarrow$ backward_set( $v, V', N$ );
SCC_DECOMP_RECUR( $v, B(v), N$ );
$V' \leftarrow V' \wedge \overline{v \vee B(v)};$
}

FMD_PRED($W,U,N$)
    *pred* ← 0;
    *front* ← $W$;
    *bound* ← $U$;
    while( *front* ≠ 0) {
        *front* ← *bound* ∩ *pre(front)* ∩ $\overline{pre(bound)}$;
        *pred* ← *pred* ∨ *front*;
        *bound* ← *bound* ∧ $\overline{front}$;
    }
    return *pred*;

FIG. 6

SCC_DECOMP_RECUR( $v,B(v),N$ )
    $F(v)$ ← forward_set($v,B(v),N$);
    if($F(v) \neq 0$)
        report $F(v)$ an SCC;
    else
        report $v$ non-SCC;
    $x$ ← $F(v) \vee v$;
    $R$ ← $B(v) \wedge \overline{x}$;
    $y$ ← FMD_PRED($x,R,N$);
    report $y$ non-SCC;
    $R$ ← $R \wedge \overline{y}$;
    $IP$ ← $pre(y \vee x) \wedge R$;
    while( $R \neq 0$ ) {
        $v$ ← random_take($IP$);
        $B(v)$ ← backward_set($v,R,N$);
        SCC_DECOMP_RECUR($v,B(v)$);
        $R$ ← $R \wedge \overline{v \vee B(v)}$;
        $IP$ ← $IP \wedge \overline{v \vee B(v)}$;
    }

FIG. 7

FORMAL VERIFICATION OF A LOGIC DESIGN THROUGH IMPLICIT ENUMERATION OF STRONGLY CONNECTED COMPONENTS

CROSS-REFERENCE TO RELATED APPLICATION

This application claims priority from co-pending provisional patent application 60/215,407, filed Jun. 30, 2000 by the inventors hereof, the entire disclosure of which is incorporated herein by reference.

FEDERALLY SPONSORED RESEARCH

This invention was made with Government support under a grant identified by Award Number CCR-981264, awarded by the National Science Foundation. The Government has certain rights in this invention.

BACKGROUND

1. Field of the Invention

This invention relates to automated, formal verification techniques for logical systems such as digital circuits or communication protocol systems. More specifically, the invention relates to algorithms for such formal verification which are based on applications of graph theory.

2. Description of the Problem

Asynchronous circuits and systems are becoming an increasingly important alternative to synchronous systems. The formal verification of these circuits and systems, however, has been given somewhat less attention than their synchronous counterparts. In addition, many aggressively designed synchronous circuits rely on two-sided timing assumptions which are difficult to verify. Formal verification is often accomplished using graph theory and analysis. A logical system can assume any of a fixed set of states. These states, and their relationship to one another, can be represented by a directed graph (digraph). Such a digraph is commonly called a state transition graph (STG).

For computer analysis, a digraph such as an STG can be represented using an explicit data structure such as an adjacency list or an adjacency matrix. The decomposition of the digraph can be done in linear time using a depth-first search. However, in many real applications, the size of the digraph can be too large for explicit algorithms to be practical. One promising alternative is to use an implicit data structure to represent the digraph, for example, a binary decision diagram (BDD). Binary decision diagrams are described in an article by R. E. Bryant, "Graph-Based Algorithm for Boolean Function Manipulation," *IEEE Transactions on Computers,* August 1986, which is incorporated herein by reference. Using a BDD, a digraph can be decomposed by finding all strongly connected components (SCC's) in the reachable state space of a finite state machine that characterizes the logical system being analyzed. Computerized algorithms that decompose a digraph in this way compute the transitive closure of the state transition relation of the machine and then compute all SCC's simultaneously. In practice, despite the advantages of an implicit data structure such a BDD, computing the transitive closure is very computationally expensive in both processor time and memory, resulting in large amounts of money and time being spent on formal verification.

SUMMARY

The present invention provides for efficient, cost-effective formal verification of logical circuits and systems using an implicit enumeration of strongly connected components that is much less computationally expensive than other known methods. Using the method of the invention, a digraph is recursively partitioned and decomposed using reachability analysis. The algorithm of the invention can be applied to partitions or legal blocks of the circuit or system being analyzed so that each one can be verified separately and hierarchically. Non-trivial, strongly connected components derived through the use of the invention can be compared to expected behavior of a circuit or system. Alternatively, the invention can be applied to detect so-called "bad cycles" which are encountered in many formal verification problems.

According to the present invention, a design is verified by first deriving a state transition graph (STG) for the design. If the logical system which is sought to be verified is large and complex, the system is partitioned into smaller logical blocks, partitions, or designs, and the algorithm is executed against each one. In any case a state transition graph for the design is recursively decomposed to determine all nontrivial strongly connected components of the STG. Each strongly connected component (SCC) represents an infinite behavior of the design. Each infinite behavior can be compared to an expected behavior in order to validate the design. This comparison can be made manually, or by a computer implemented comparison algorithm. In one embodiment, the algorithm of the invention recursively decomposes the STG by determining a backward set for each node in the STG, and finding non-trivial SCC's in the backward set. It is also possible to use forward sets, or a combination of forward and backward sets.

In another embodiment of the invention, formal verification may be extended by determining if any non-trivial SCC derived as described above represents a bad cycle indicating a problem with a design. This determination is made by finding out if a non-trivial SCC is not in any cycle set. In another embodiment, the determination is made by finding out if an SCC intersects compliment sets of all cycle sets. Either bad cycle algorithm can stop and prompt an operator or designer upon finding the first bad cycle. Alternatively, an algorithm may find all bad cycles and present these to the designer.

In example embodiments of the invention, computer software is used to implement many aspects of the invention. The software can be stored on a medium. The medium can be magnetic, such as a diskette, tape, or fixed disk, or optical, such as a CD-ROM or DVD-ROM. The software can also be stored in a semiconductor device. Additionally, the software can be supplied via the Internet or some other type of network. A workstation or computer system that typically runs the software includes a plurality of input/output devices and a processor. The software in combination with the computer system and any peripheral hardware forms the means to execute the method of the invention.

BRIEF DESCRIPTION OF THE DRAWINGS

FIG. 1 is divided into FIGS. 1A and 1B for convenience.

FIG. 3 is a digraph for the circuit of FIG. 1, shown being decomposed according to the invention. FIG. 3 is divided into FIGS. 3A, 3B, and 3C for convenience.

FIG. 4 shows a pseudo-code listing for the top-level algorithm of the present invention.

FIG. 6 is a pseudo-code listing of a subroutine for computing predecessors with finite maximum distance as used with the present invention.

FIG. 7 is a pseudo-code listing of a subroutine that performs recursive decomposition of a backward set according to the present invention.

FIG. 9 is divided into FIGS. 9A and 9B for convenience.

DETAILED DESCRIPTION OF SOME EMBODIMENTS

The present invention is useful in the formal verification of any design of a logical system that can be described with reference to a number of states. The invention is useful, for example, in formal verification of synchronous and asynchronous digital circuits. It should be noted that while the invention is useful in the verification of digital circuits of these types, it can find equally good application in other problems, for example, the analysis of a communication protocol in which various states of an encoding algorithm depend on other states. The algorithm of the invention is used to verify a logical design which may be a portion of a larger logical system, or may be stand alone. With complex circuits or systems, it is most useful to partition the circuit or system into legal blocks and then use a symbolic partial order approach to generate specifications for each block. Each block then represents a design which can be verified separately.

Figure 1A:
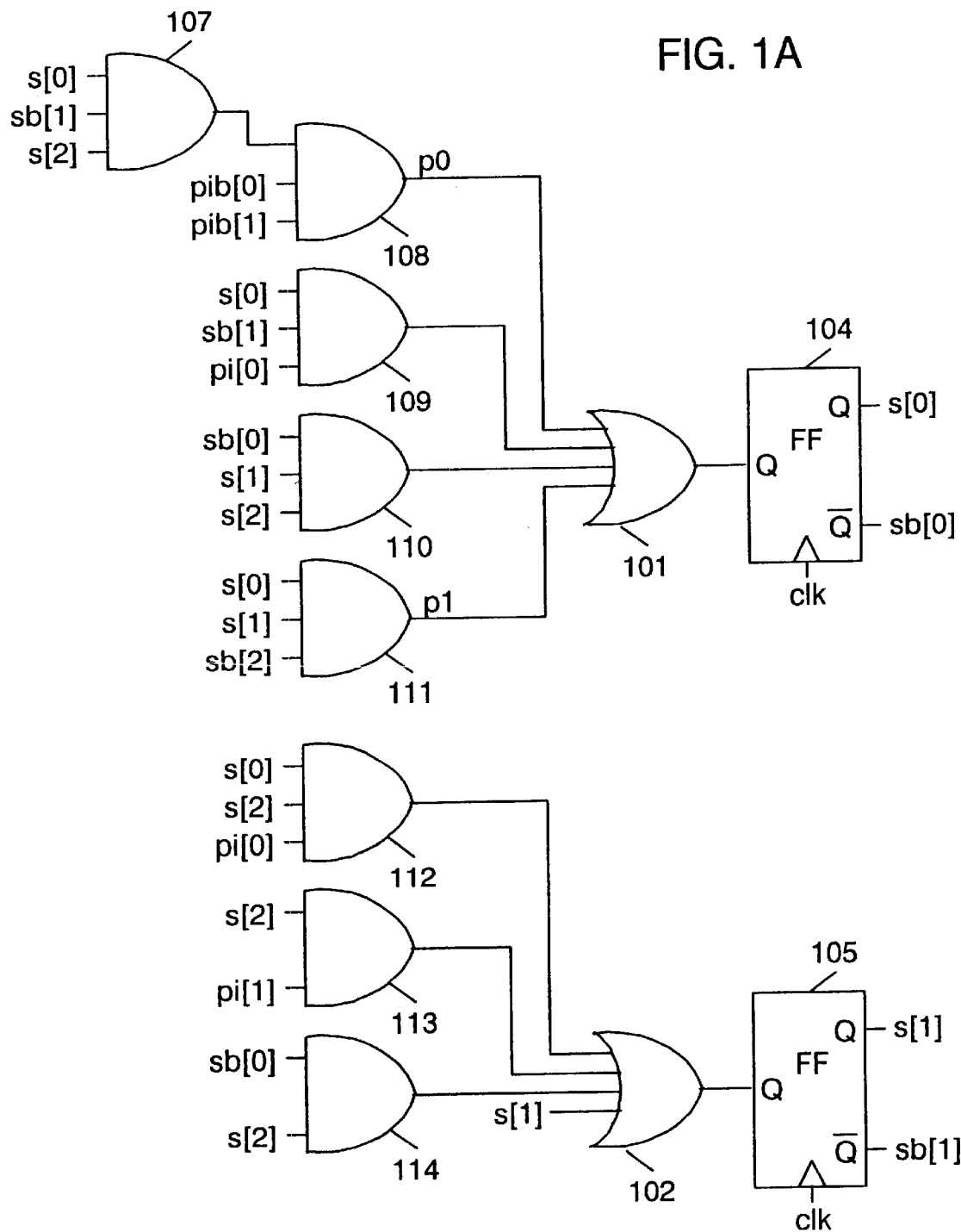
FIG. 1 is a logic diagram of an example digital circuit with which the present invention can be used.
Figures 1B, 2:
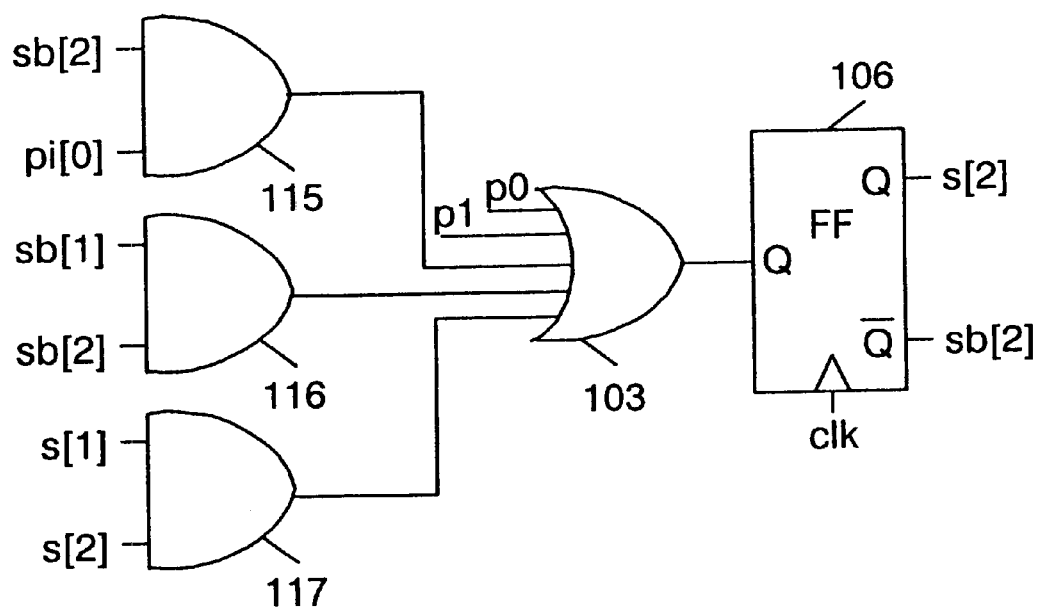
FIG. 2 is a state table for the circuit of FIG. 1.

FIG. 1 illustrates an example digital circuit, the operation of which can be verified through use of the invention. A portion of the circuit is shown in FIG. 1A, and another portion of the circuit is shown in FIG. 1B. The circuit of FIG. 1 has three state variables S[0], S[1], and S[2]. The circuit of FIG. 1 also has two primary inputs, pi[0] and pi[1]. OR gates 101, 102, and 103 drive flip-flops 104, 105, and 106, respectively. Note that the flip-flops in the circuit of FIG. 1 provide both a state variable and its inverted version. The inverted version of a state variable is annotated with an lowercase "b". For purposes of this example, it is assumed that the environment in which the circuit is used provides both primary inputs and their inverted versions. The inverted versions of the primary inputs are designated pib[0] and pib[1]. The only other components in this particular circuit are AND gates. Gates 107, 108, 109, 100, 111, and 112 are three-input AND gates. Gates 113, 114, 115, 116, and 117 are two-input AND gates.

FIG. 2 illustrates a state labeling table for the circuit of FIG. 1. On the left side of the table, are three columns, one for each of the three state bits. The right side of the table contains a label for each state which the three bits may represent. Part (a) of FIG. 3 illustrates a state transition graph (STG) which uses the labeling of the state labeling table of FIG. 2. FIG. 3 is divided into FIGS. 3A, 3B, and 3C to illustrate various aspects of the invention, as described below. This STG describes the state space of the circuit of FIG. 1 under the usual assumption that the primary inputs are non-deterministic and can be obtained using any of many different known techniques. Formal analysis of an STG like that shown in FIG. 3 provides useful information to a circuit designer. First, the possible infinite behaviors that the circuit can exhibit are described by all of the strongly connected components (SCC's) in the STG. Secondly, formal analysis of the STG can determine whether the circuit satisfies a given allowed behavior.

An STG, like that shown in FIG. 3A, is a particular type of directed graph or "digraph." As such, the STG contains nodes and directed edges. In this particular example, the nodes represent states of the circuit of FIG. 1 and the edges represent possible state transitions. A digraph may be partitioned into backward sets (or differences of backward sets) of some of its nodes, and then strongly connected components of the graph can be restricted to each of the partitions. This technique leads to a "divide and conquer" strategy. Because a digraph and its transpose have the same set of strongly connected components, the above strategy may also be carried out in terms of forward sets. Partitioning is also possible by interleaving the computation of backward sets and forward sets. For purposes of this example, the algorithm of the invention will be explained based on a backward set partitioning scheme. It should be noted that the principles of the invention can be applied using decomposition with forward sets, or the interleaving of forward and backward sets as described above.

The method of the present invention can be implemented in a general purpose computer system with any computer programming language. In one embodiment, the algorithm uses a set of subroutines. These subroutines use an efficient data structure called a binary decision diagram (BDD) to efficiently represent sets of states. BDD's can be thought of as implicit representations of sets of nodes or edges of a directed graph. BDD's are well known and there are many commonly available computer program packages that implement graphics functions using various subroutines that work with BDD's. One such package is described in, Breton et al., "VIS: A System for Verification and Synthesis," *Proceedings of the International Conference on Computer-Aided Verification*, pages 428–32, 1996, which is incorporated herein by reference. In one embodiment of the invention, specific subroutines used in the verification process are described below:

INTERSECTION (a, b), denoted for brevity a∧b: This subroutine takes two arguments a and b that are BDD's, each of which can be considered a set, and returns one result which is the intersection of the two sets.

UNION (a, b), denoted for brevity a∨b: This subroutine takes two arguments a and b that are BDD's, each of which can be considered a set, and returns one result which is the union of the two sets.

random_take (V'), a function that randomly picks a node from the set, V' also easily implemented using commonly available BDD software sub-routines.

backward_set (v,V',N) returns the backward set of v restricted to set V' of the directed graph represented by N. Recall that the backward set is defined as the subset of nodes in the graph G=(V,E) that can reach v. Mathematically this can be defined as the set $\{u \in V | u \rightsquigarrow v\}$. As an example, in the directed graph for the circuit of FIG. 1, shown in FIG. 3, B(3)={1,2,3,5,6}, B(4)={1,2,3,4,5,6,7,8}. There are many efficient ways of implementing this function using basic BDD sub-routines available in commonly available BDD software packages such as vis-1.3.

forward_set (v V'N ) of a node $v \in V$ is the set of nodes reachable from v. Recall from that the forward defined as the set of nodes in the graph G=(V,E) that can be reached from v. Mathematically this can be defined as the set $\{u \in V | v u\}$. As an example, in the directed graph shown in FIG. 3, F(3)={3,4,8}. Again, there are many ways of implementing this function efficiently using basic BDD sub-routines available in commonly available BDD software packages such as vis-1.3.

Inequality check: A≠B, this function takes two BDD's and returns TRUE if the sets they implicitly represent are not identical and FALSE if the two sets are identical.

Complementation, denoted $\overline{A}$: this function takes a BDD, A, and returns its complement, that is, it returns all nodes that are not in the argument A.

Immediate predecessors (IP), pre(S): this function returns the immediate predecessors of a set of nodes S and is easily implemented using basic BDD operations using the digraph representation N.

Figure 5:
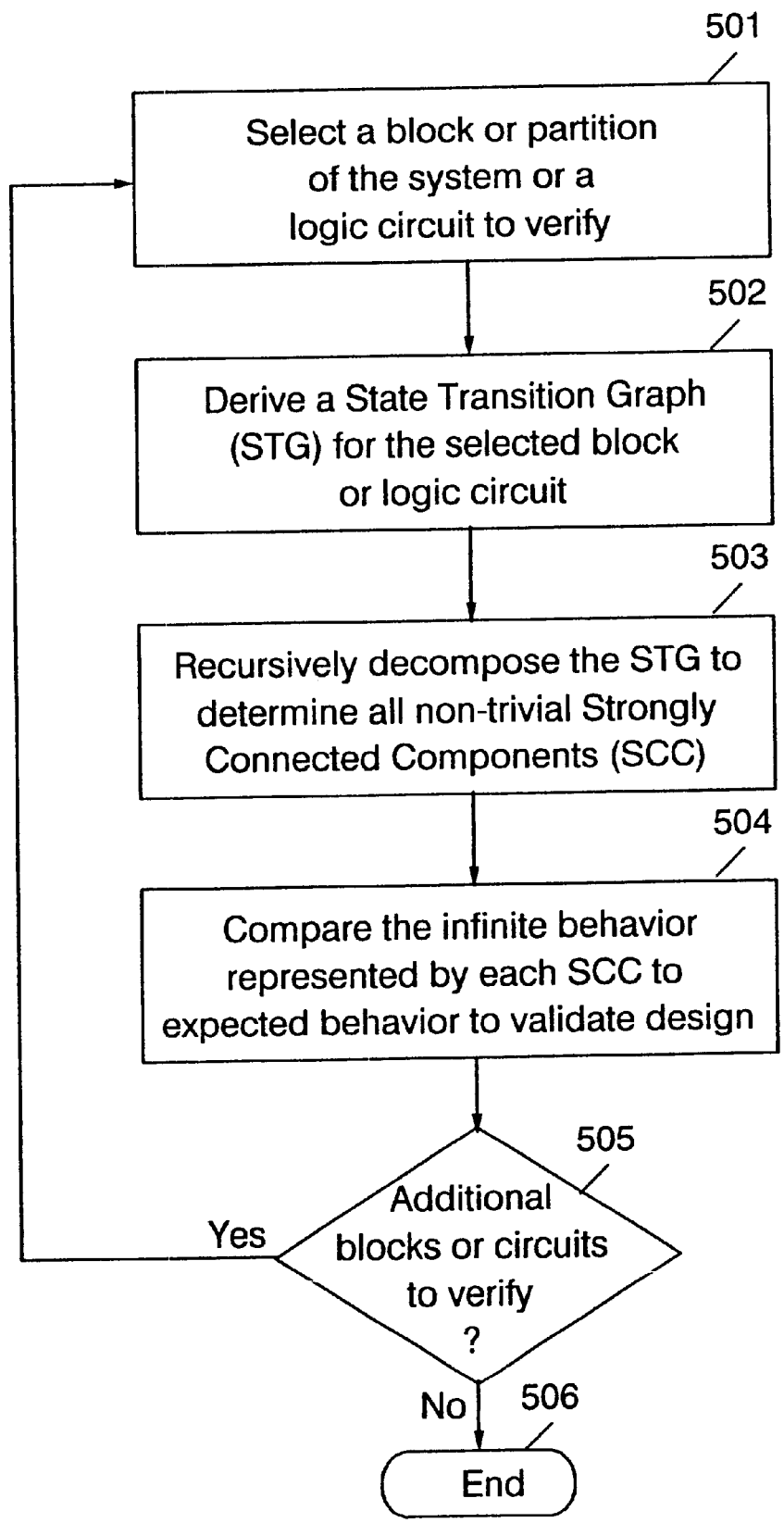
FIG. 5 shows a flow chart illustrating the method according to one embodiment of the invention.

Representations of the top level algorithm that can be programmed in any language to perform the verification described herein are shown in FIGS. 4 and 5. FIG. 4 illustrates the algorithm in printed pseudo-code. To solve a specific problem the user must call this algorithm, SCC_DECOMP(N, V), where N is the BDD representation of the edges in the graph G=(V, E). The algorithm reports all the non-trivial strongly connected components in the graph before terminating. In the pseudo-code of FIG. 4, a left-going arrow refers to the assignment of the result of the function clause on the right of the left-going arrow to the variable on the left of the left-going arrow. Notice that the algorithm is a recursive algorithm in that it calls itself. Also notice that in any one line of the algorithm in FIG. 4, the use of multiple functions may be referred to in the order of functions that should be applied follows the standard rules of mathematics.

FIG. 5 illustrates the algorithm in a flow chart fashion. In FIG. 5, more specific reference is made to solving a verification problem in a practical logic system. At step 501, in many cases, a particular block or partition of a system or logic circuit is selected on which to execute the algorithm of the invention. At step 502, a state transition graph (STG) for the selected block or logic circuit is derived. The graph is recursively decomposed at step 503 to determine all non-trivial strongly connected components in the graph. Once all of the SCC's have been found, infinite behavior represented by each SCC can be compared to the expected behavior of the system to validate the design. The comparison, shown in step 504, can be handled in a number of ways. In the simplest embodiment, the comparison is simply done manually based on the results of the decomposition of the state transition graph into SCC's. Alternatively, a program for comparing the behavior represented by the SCC's to specific behavior represented in another data structure and producing a result for display to an operator can be used. At step 505, a determination is made as to whether there are additional blocks of the circuit or system to be verified. If so, the process repeats. If not, the execution of the method ends at step 506.

A core procedure of the algorithm, SCC_DECOMP_RECUR(v,B(v),N), recursively decomposes, B(v) into SCC's and a set of non-SCC nodes. As an optimization, the procedure SCC_DECOMP_RECUR() uses a sub-routine that computes predecessors with finite maximum distance, also referred to as "FMD predecessors." A node u is an FMD predecessor of node v if any path from u to v has finite length. That is to say, any path from u to v must not pass any SCC. A necessary condition for this is that u must be a non-SCC node. The set of FMD predecessors of a set of nodes W, denoted by FMD_PRED(W), is defined to be the FMD predecessors of all nodes in W. FIG. 6 gives an implicit algorithm that iteratively computes the set FMD_PRED(W) restricted to a set U given the digraph representation N. FIG. 7 illustrates a psuedo-code example of the SCC_DECOMP_RECUR() algorithm.

For the circuit in FIG. 1, in one embodiment of the invention, the above-defined algorithms identify the SCC's in its STG using the following steps. The STG in FIG. 3A from the circuit shown in FIG. 1. SCC_DECOMP_RECUR(3, B(s), N) is called on a random state, e.g., state 3, highlighted in the STG as shown in FIG. 3B. The call to SCC_DECOMP_RECUR(3, B(3), N) first computes F(3) restricted to B(3) by computing forward_set(3, B(3), N), and reports the result F(3)∩B(3)={3} to be an SCC. Next, the algorithm computes FMD_PRED({3}, {1,2,5,6}, N)={1,2}, as described below, which is reported to be a set of non-SCC nodes, and the IP set is computed to be {5,6}.

Now consider the computation of FMD_PRED({3}) restricted to the set U={1,2,5,6} in more detail. Initially, bound is initialized to U and front is initialized to {3}. In the iteration of the while loop, front is updated to be the set of node that can immediately reach {3} but no node in U, i.e., front is set to be {2}. Notice that node 2 is an FMD predecessor of node 3. Moreover, notice that node 6 is not in this set because although it can immediately reach node 3 it can also reach itself which is in U. After removing front from bound and adding front to the set of FMD predecessors pred, a second iteration is initiated. In this iteration, front is updated to be {1} because node 1 is the only node that can both immediately reach {2} (the previously computed front), but reach no other node in bound. In particular, node 5 is excluded from front because it can reach node 6 in bound. After again updating the variables, the third iteration finds no node that can reach {1}, which terminates the algorithm, yielding the final set of FMD predecessors to be {1,2}.

At this point, the procedure has reduced the problem to decomposing the digraph in FIG. 3C. Suppose node 6 is picked from the IP set, the procedure calls SCC_DECOMP_RECUR(6,B(6),1) which, in this case, leaves no nodes to be decomposed when it returns. The result is the identification of the three strongly connected components, {3}, {6}, and {4,8}, each describing some possible infinite behavior of the circuit. This infinite behavior of the circuit will involve repeated visits to states in set {3}, set {6} or set {4,8}. The designer can compare this behavior to that which he/she expects to validate his/her design.

Figure 8:
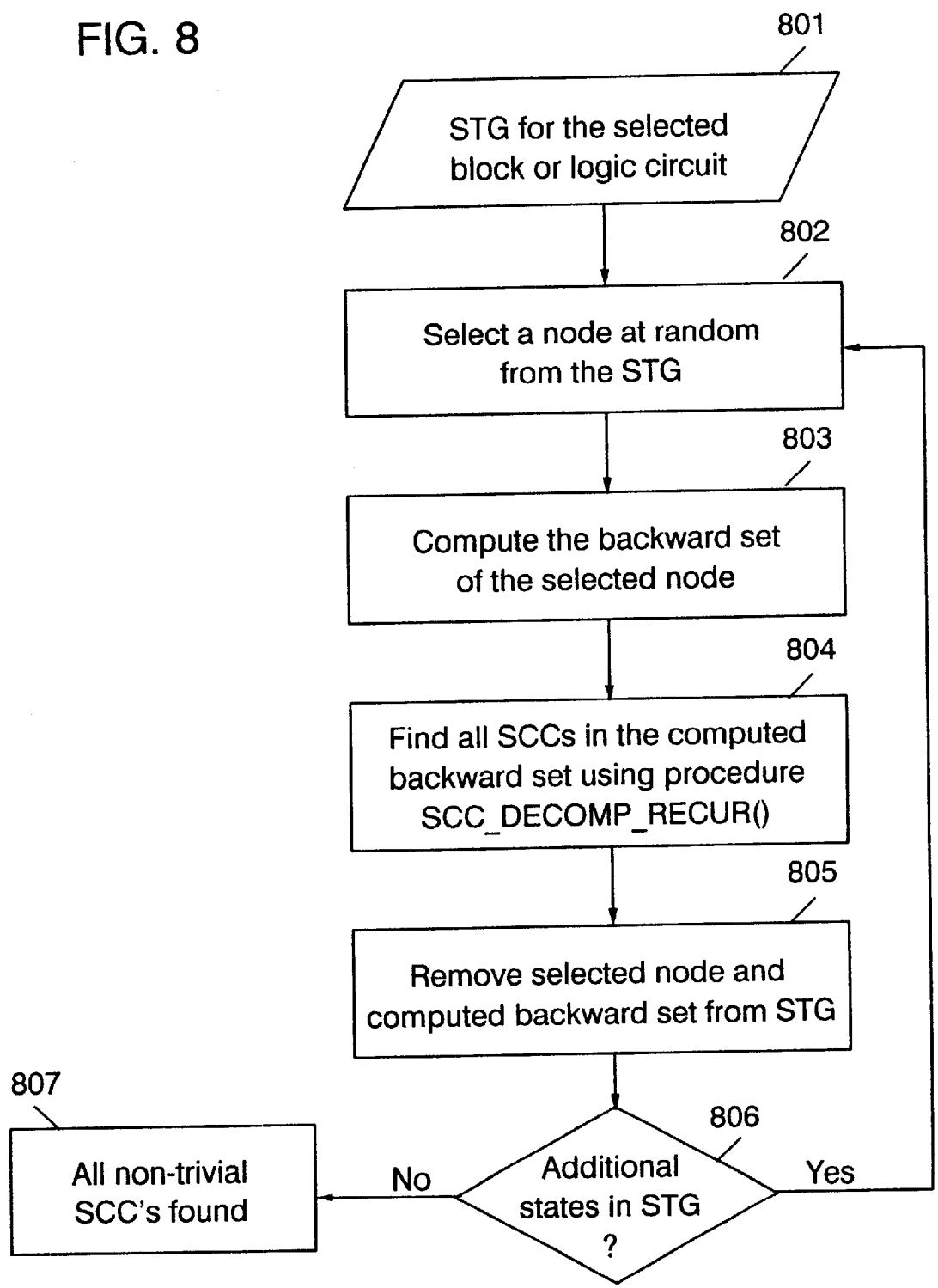
FIG. 8 is a flow chart, which illustrates recursively decomposing a state transition graph according to one embodiment of the present invention.

FIGS. 8 and 9 illustrate further detail of the method of the invention in flow chart form. FIGS. 8 and 9 essentially break down the flow chart of FIG. 5 into greater detail. FIG. 8 illustrates the recursive decomposition of an STG to determine all non-trivial strongly connected components. Input 801 is of the STG for the selected block, logic circuit, or partition to be verified. At step 802 a node is selected at random from the input STG. At step 803, the backward set for the selected node is computed. At step 804, all SCC's in the computed backward set are derived using the previously discussed decomposition procedure, SCC_DECOMP_RECUR(). Once this process is complete, the selected node and the backward set are removed from the STG at step 805. At step 806 a determination is made as to whether there are additional states left in the STG. If additional states need to be decomposed to find additional SCC's, processing returns to step 802 and a node is selected at random. Note that if only one node is left there is no selection needed at step 802. At step 806, if all nodes have been processed, processing stops at 807, since all nontrivial SCC's have been found.

Figure 9A:
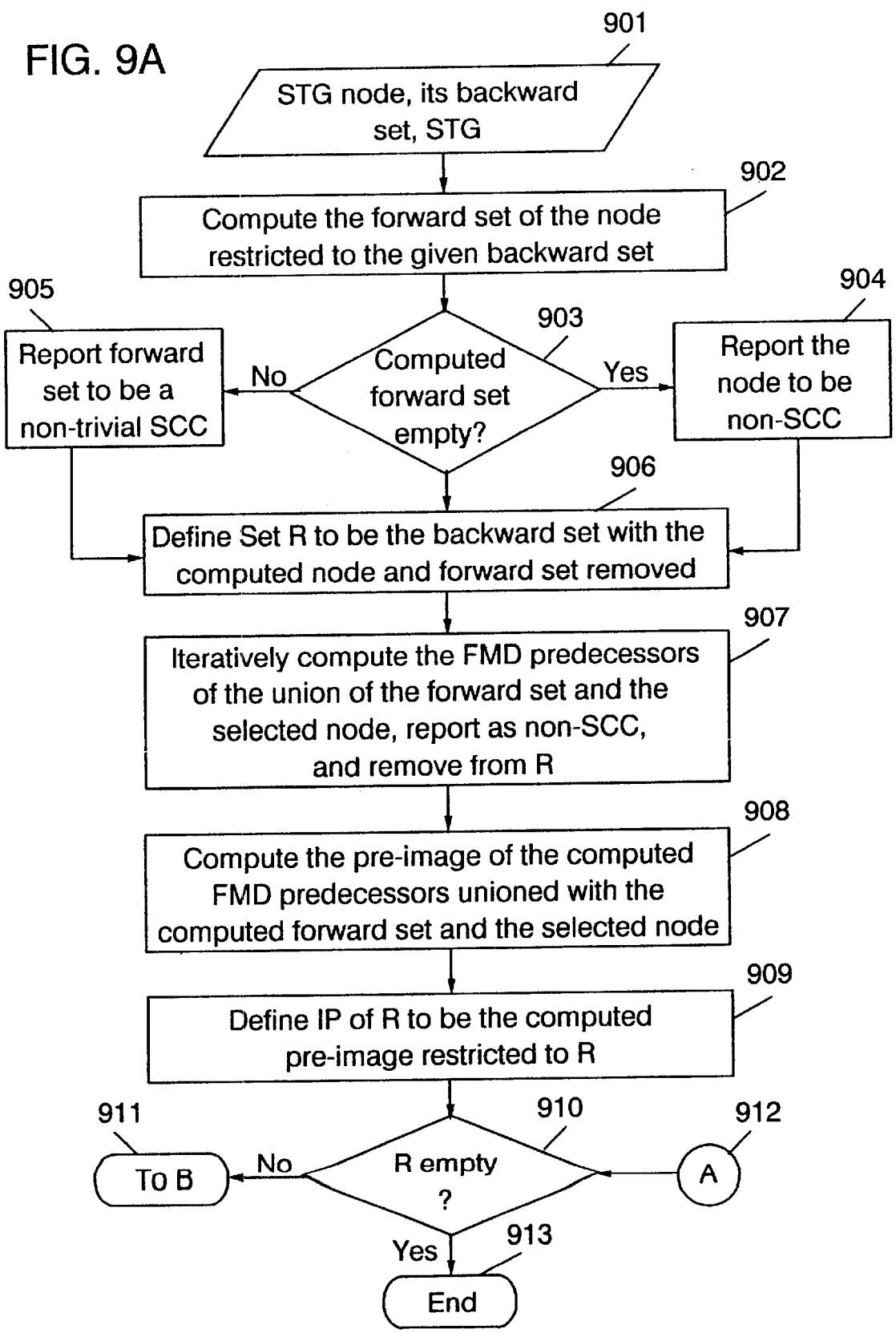
FIG. 9 further illustrates further detail of recursively decomposing a state transition graph according to the present invention.
Figure 9B:
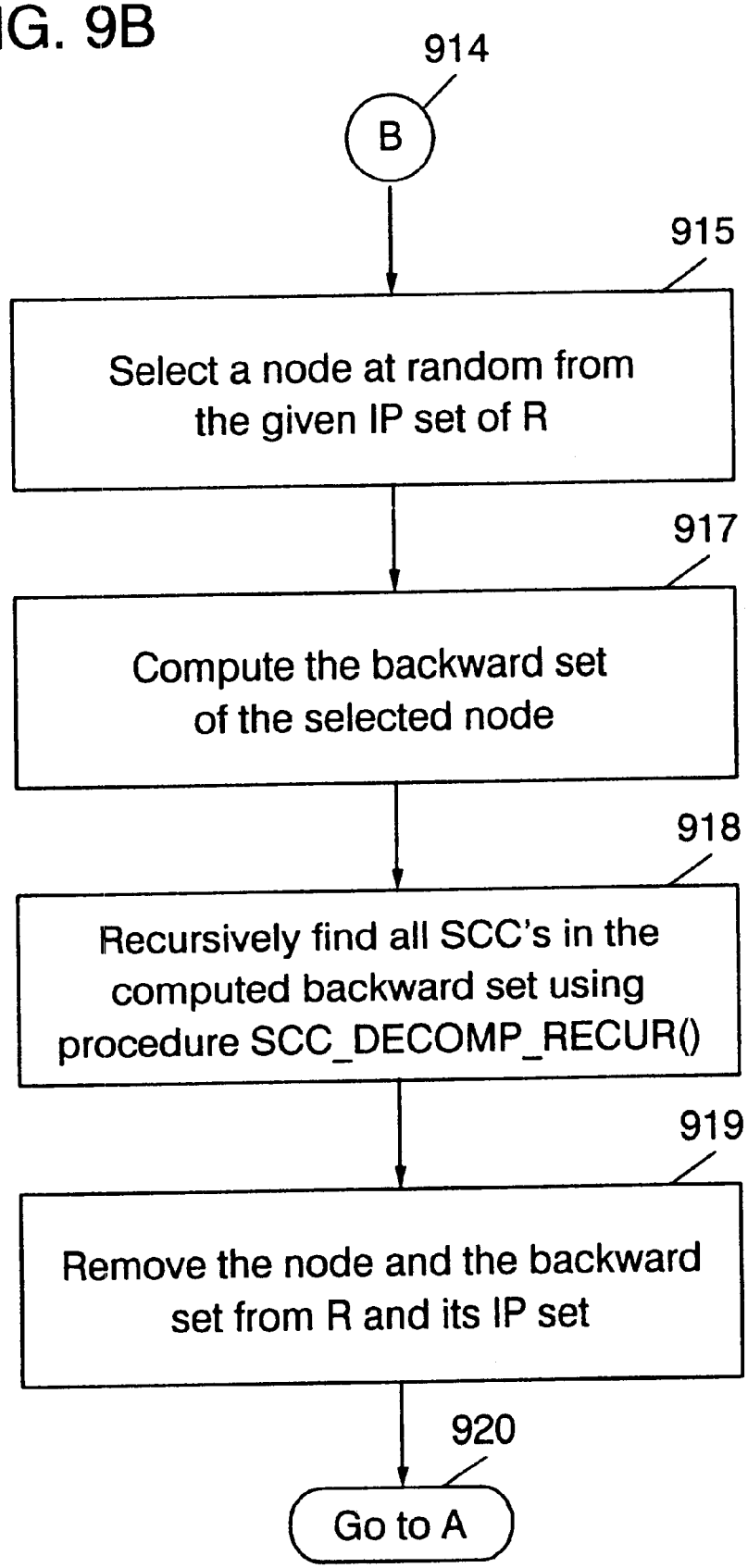

FIG. 9 is a detailed flow chart illustrating how the SCC's are derived from the backward set using the decomposition algorithm. FIG. 9 is divided into FIGS. 9A and 9B for convenience. Input 901, consisting of the node being analyzed, its backward set, and the state transition graph, is received at step 902, where the forward set of the node restricted to the given backward set is computed. At step 903 a determination is made as to whether the computed forward set is empty. If so, the node is reported to be non-SCC at 904. If the forward set is not empty at step 903, it is reported to be a non-trivial SCC at step 905. In any case, a set R is defined to be the backward set with the computed node and forward set removed at step 906. At step 907 the fixed minimum distance predecessors of the union of the forward set and the selected node are computed using the FMD_PRED() algorithm. These are reported as non-SCC and removed from the set R. At step 908, a pre-image of the computed FMD predecessors is unioned with the computed forward set and the selected node. At step 909 initial predecessors of the set R are defined to be the computed pre-image restricted to the set R. At step 910 a determination is made as to whether the set R is empty. If so, the routine ends at 913. If not, processing continues at point B, 914 of FIG. 9B. At 915 a node is selected at random from the given initial predecessor set of the set R. This selection uses the set R, its initial predecessor set, and the STG. At step 917 the backward set of the selected node is computed. At step 918 all SCC's in the computed backward set are recursively found using the SCC decomposition algorithm, SCC_DECOMP_RECUR(). Finally, at step 919 the node is removed from the backward set, set R, and the initial predecessor (IP) set, and processing returns to point A, 912 in FIG. 9A at step 920 of FIG. 9B.

Note that the algorithm of the invention is described in terms of binary decision diagrams (BDD's) because such diagrams are an efficient means of representing sets of nodes. The invention, however, simply requires some means of representing these sets. The basic operations as described in the previous discussion and the accompanying flow charts carry out the invention the same way regardless of how the state transition graphs are represented. Also note that the procedure to find finite maximum distance predecessors is an optimization for the invention. Alternatives to this procedure are feasible and can enable the invention equally well.

Figure 10:
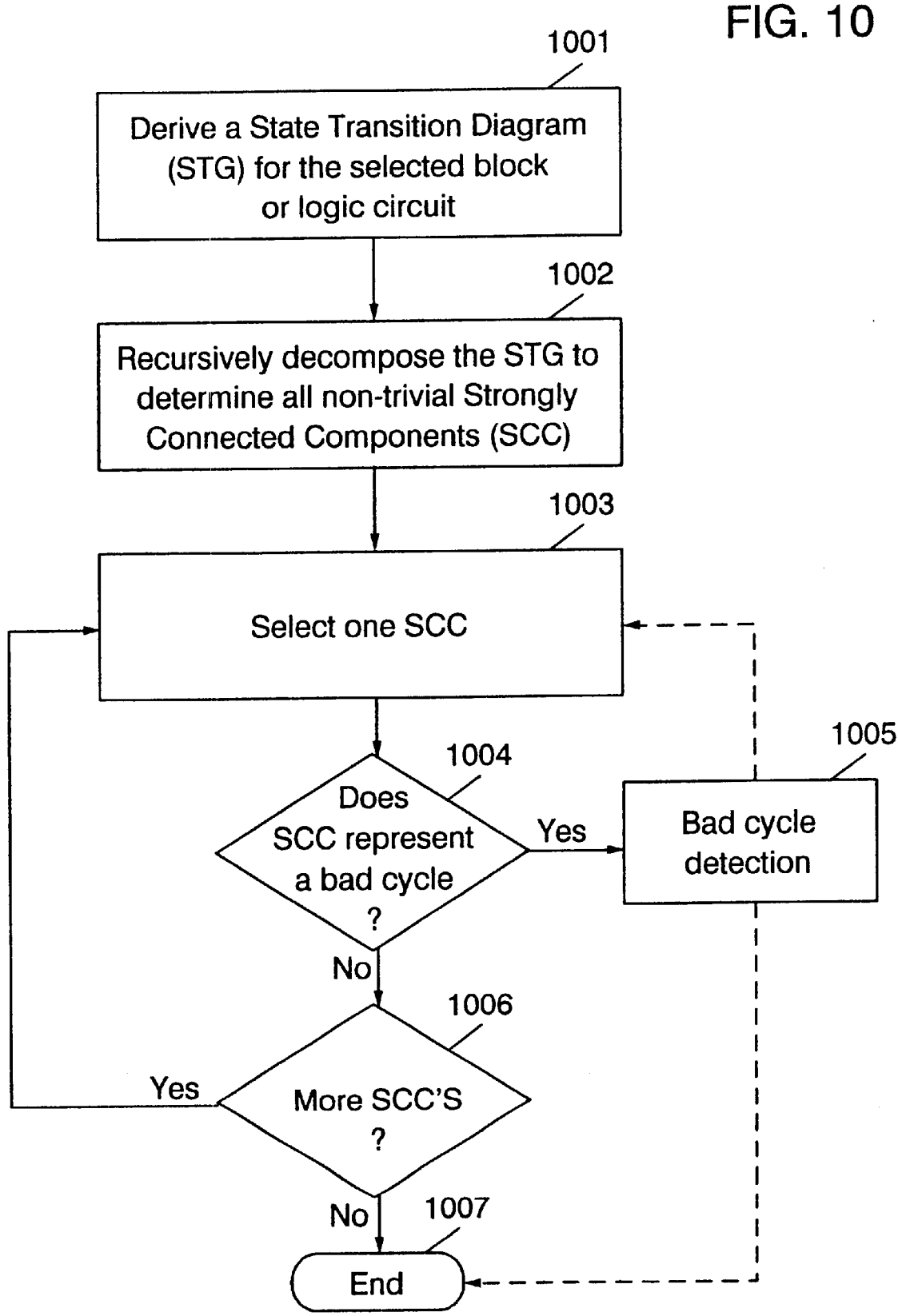
FIG. 10 is a flow chart, which illustrates the application of the algorithm of the present invention to bad cycle detection.

FIG. 10 is a flow chart that illustrates how to apply the invention more directly to automated verification of logical systems such as digital circuits. FIG. 10 describes the application of the algorithm of the invention to the "bad cycle detection problem." The bad cycle detection problem is encountered in many formal verification tasks and is stated as follows. Given a set of state sets, called cycle sets, if one can determine that there is any reachable cycle of states that is not contained in at least one cycle set, such a cycle is called a bad cycle. Such a cycle reflects a cyclic behavior that is unexpected and/or unwanted. States in any bad cycle are referred to as bad states.

For the circuit depicted in FIG. 1, if the given cycle sets are {{4,8}}, the circuit has two bad states, i.e., state 3 and 6. This means that the designer expected infinite behavior to be restricted to states 4 and 8 but did not expect infinite behavior to include states 3 or 6, identifying some problem with the circuit. However, if the given cycle sets are {{4,8}, {4}, {6}}, the circuit has no bad state, since all infinite behaviors that the circuit can exhibit are properly specified by the designer.

This embodiment of our invention involves first, finding all SCC's (exactly), and then, verifying whether each SCC is contained in at least one cycle set. In particular, there exists a bad cycle if and only if there exists an SCC that is not contained in at least one cycle set. The key intuition behind this fact is that if an SCC exists that is not contained in at least one cycle set, then the SCC itself forms at least one (possibly non-simple) cycle that is not covered by any cycle set.

FIG. 10 illustrates two variances of a method applying the present invention to the bad cycle detection problem in the context of analyzing a system such as a digital circuit. In either case the STG for the selected block or circuit to be verified is derived at step 1001. The STG is recursively decomposed to determine all non-trivial strongly connected components at step 1002. At this point, the results are used to determine bad cycles. At step 1003, one SCC is selected. A determination is made as to whether the SCC represents a bad cycle at step 1004. In one version of the method, if the answer is yes, bad cycle detection is reported at step 1005. This ends the execution of the algorithm at 1007, if the user simply wants to be notified of the first bad cycle detection. If the user would rather have a report of all bad cycles found in the circuit or system being verified, processing after bad cycle detection of step 1005 returns to step 1003 and another SCC is selected for verification. In this later case, processing does not end until it is determined at step 1006 that there are no more SCC's to be tested.

With respect to step 1004 of FIG. 10, there are two ways to determine if an SCC represents a bad cycle. As previously mentioned, if there is any reachable cycle of states that is not contained in at least one cycle set, that cycle is bad. Therefore, to determine if an SCC represents a bad cycle, an algorithm which is implementing the invention would simply check cycle sets to determine if the SCC is present. Once the SCC was determined to be in a cycle set, the SCC could be assumed not to represent a bad cycle. If all cycle sets are checked and the SCC is not present in any of them, the SCC represents a bad cycle. Alternatively, a cycle is bad if and only if it intersects with the compliments of all cycle sets, since this would mean it is not contained in any cycle set. Thus, an alternative way to determine whether an SCC represents a bad cycle is to identify all SCC's that intersect with the compliment of the first cycle set. If an SCC does not intersect with the compliment of the first cycle set, the SCC does not represent a bad cycle. However, if it does intersect with the compliment of the first cycle set, it is then checked against the compliments of all other sets. If the SCC intersects with the compliments of all sets, it forms a bad (possibly non-simple) cycle. If no strongly connected components intersect with the compliments of all sets, no bad cycle exists. Heuristics can be used to guide the choice of the first cycle set to improve the run time in the case where bad cycle determination is based on determining intersection with the compliments of cycle sets.

Figure 11:
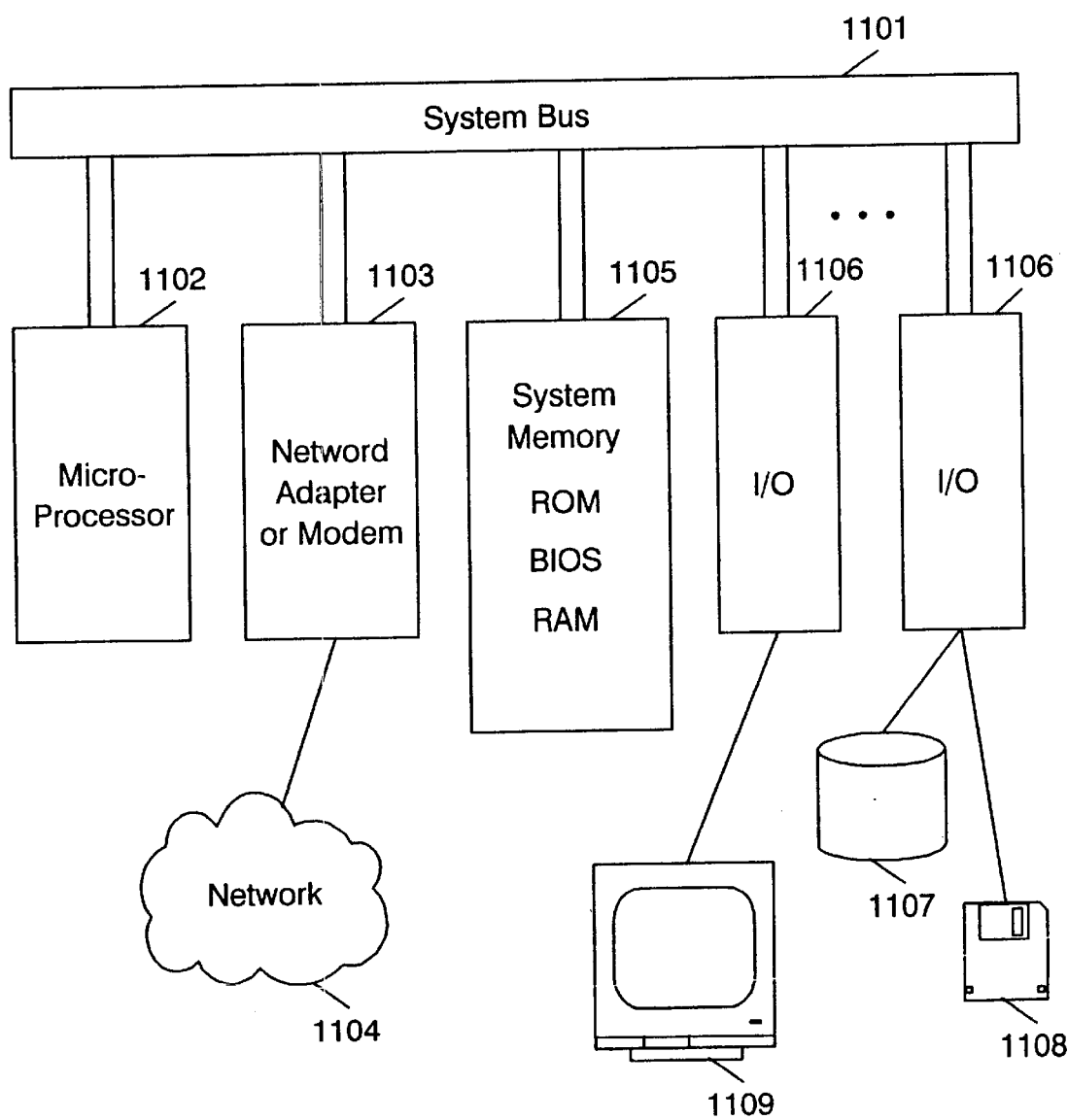
FIG. 11 shows a functional block diagram of a computer system which implements the present invention.

As previously discussed, in one embodiment, the invention in implemented through software operating on a programmable computer system such as a personal computer or workstation. FIG. 11 illustrates further detail of a computer system that is implementing the invention in this way. System bus 1101 interconnects the major components. The system is controlled by microprocessor 1102, which serves as the central processing unit (CPU) for the system. System memory 1105 is typically divided into multiple types of memory or memory areas such as read-only memory (ROM), random-access memory (RAM) and others. The system memory may also contain a basic input/output system (BIOS). A plurality of general input/output (I/O) adapters or devices, 1106, are present. Only two are shown for clarity. These connect to various devices including a fixed disk drive, 1107, a diskette drive, 1108, and a display, 1109. Computer program instructions for implementing the functions of the invention are stored on the fixed disk, 1107, and are partially loaded into memory, 1105 and executed by microprocessor 1102. The system optionally includes another I/O device, a network adapter or modem, shown at 1103 for connection to a network, 1104. It should be noted that the system of FIG. 11 is meant as an illustrative example only. Numerous types of general purpose computer systems are available and can be used. Available systems include those that run operating systems such as Windows™ by Microsoft and various versions of Unix.

Elements of the invention may be embodied in hardware and/or software as computer program code (including firmware, resident software, microcode, etc.). Furthermore, the invention may take the form of a computer program product on a computer-usable or computer-readable storage medium having computer-usable or computer-readable program code embodied in the medium for use by or in connection with an instruction execution system such as that shown in FIG. 11. Such mediums are illustrated graphically in FIG. 11 to represent, for example, the diskette drive. A computer-usable or computer-readable medium may be any medium that can contain, store, communicate, or transport the program for use by or in connection with an instruction execution system. The computer-usable or computer-readable medium, for example, an electronic, magnetic, optical, electromagnetic, infrared, or semiconductor system. Note that the computer-usable or computer-readable medium could even be paper or another suitable medium upon which a program is printed.

We have described herein specific embodiments of an invention. One of ordinary skill in the computing arts and in verification based on graph theory will quickly recognize that the invention has other applications in other environments. In fact, many embodiments and implementations are possible. The following claims are in no way intended to limit the scope of the invention to the specific embodiments described above.

We claim:

1. A method of verifying a design for at least a portion of a logic system, the method comprising:
    deriving a state transition graph (STG) for the design, the STG further comprising a plurality of nodes representing values of state variables in the logic system, and a plurality of edges between nodes describing state transitions;
    recursively decomposing the STG to determine all non-trivial strongly connected components of the STG; and
    comparing an infinite behavior represented by each strongly connected component to an expected behavior of the design to validate the design.

2. The method of claim 1 wherein the recursively decomposing step, for each node in the STG, further comprises:
    determining a backward set for the node; and
    finding all non-trivial strongly connected components in the backward set.

3. The method of claim 1 wherein the recursively decomposing step, for each node in the STG, further comprises:
    determining a forward set for the node; and
    finding all non-trivial strongly connected components in the forward set.

4. The method of claim 1 wherein the recursively decomposing step is accomplished through an interleaved determination of forward and backward sets.

5. A method of verifying a design for at least a portion of a logic system comprising:
    deriving a state transition graph (STG) for the design, the STG comprising a plurality of nodes representing values of state variables in the logic system, and a plurality of edges between nodes describing state transitions;
    recursively decomposing the STG to determine all non-trivial strongly connected components of the STG; and
    for at least one non-trivial strongly connected component (SCC), determining when the non-trivial SCC represents a bad cycle indicating a problem with the design.

6. The method of claim 5 wherein determining when the non-trivial SCC represents a bad cycle is accomplished by determining when the non-trivial SCC is not in any cycle set.

7. The method of claim 5 wherein determining when the non-trivial SCC represents a bad cycle is accomplished by determining when the non-trivial SCC intersects compliment sets of all cycle sets.

8. A computer program product including a computer usable medium having a computer program embodied thereon, the computer program for verifying a logic design, the computer program comprising:
    instructions for deriving a state transition graph (STG) for the logic design, the STG comprising a plurality of nodes representing values of state variables in the logic design, and a plurality of edges between nodes describing state transitions;
    instructions for recursively decomposing the STG to determine all non-trivial strongly connected components of the STG; and
    instructions for enabling the validation the logic design by comparing an infinite behavior represented by a strongly connected component to an expected behavior of the logic design.

9. The computer program product of claim 8 wherein the logic design can be a portion of a logical system, and wherein the computer program further comprises instructions for partitioning the logical system into a plurality of logic designs.

10. The computer program product of claim 8 wherein the instructions for recursively decomposing further comprise:
    instructions for determining a backward set for a node in the STG; and
    instructions for finding all non-trivial strongly connected components in the backward set.

11. The computer program product of claim 9 wherein the instructions for recursively decomposing further comprise:
    instructions for determining a backward set for a node in the STG; and
    instructions for finding all non-trivial strongly connected components in the backward set.

12. The computer program product of claim 8 wherein the instructions for recursively decomposing further comprise:
    instructions for determining a forward set for a node in the STG; and
    instructions for finding all non-trivial strongly connected components in the forward set.

13. The computer program product of claim 9 wherein the instructions for recursively decomposing further comprise:
    instructions for determining a forward set for a node in the STG; and
    instructions for finding all non-trivial strongly connected components in the forward set.

14. The computer program product of claim 8 wherein the instructions for recursively decomposing further comprise instructions for interleaved determination of forward and backward sets.

15. The computer program product of claim 9 wherein the instructions for recursively decomposing further comprise instructions for interleaved determination of forward and backward sets.

16. A computer program product including a computer usable medium having a computer program embodied thereon, the computer program for verifying a logic design, the computer program comprising:

instructions for deriving a state transition graph (STG) for the logic design, the STG comprising a plurality of nodes representing values of state variables in the logic design, and a plurality of edges between nodes describing state transitions;

instructions for recursively decomposing the STG to determine all non-trivial strongly connected components of the STG; and instructions for determining when a non-trivial strongly connected component (SCC) represents a bad cycle indicating a problem with the logic design.

17. The computer program product of claim 16 wherein the instructions for determining when the non-trivial SCC represents a bad cycle further comprise instructions for determining when the non-trivial SCC is not in any cycle set.

18. The computer program product of claim 16 wherein the instructions for determining when the non-trivial SCC represents a bad cycle further comprise instructions for determining when the non-trivial SCC intersects compliment sets of all cycle sets.

19. Apparatus for verifying a logic design comprising:

means for deriving a state transition graph (STG) for the logic design, the STG comprising a plurality of nodes representing values of state variables in the logic design, and a plurality of edges between nodes describing state transitions;

means for recursively decomposing the STG to determine all non-trivial strongly connected components of the STG; and means for enabling the validation the logic design by comparing an infinite behavior represented by a strongly connected component to an expected behavior of the logic design.

20. Apparatus for verifying a logic design comprising:

means for deriving a state transition graph (STG) for the logic design, the STG comprising a plurality of nodes representing values of state variables in the logic design, and a plurality of edges between nodes describing state transitions;

means for recursively decomposing the STG to determine all non-trivial strongly connected components of the STG; and means for determining when a non-trivial strongly connected component (SCC) represents a bad cycle indicating a problem with the logic design.

21. A computer system enabled to verify a design for at least a portion of a logic system, the computer system comprising at least one processor executing a computer program further comprising:

instructions for deriving a state transition graph (STG) for the logic design, the STG comprising a plurality of nodes representing values of state variables in the logic system, and a plurality of edges between nodes describing state transitions;

instructions for recursively decomposing the STG to determine all non-trivial strongly connected components of the STG; and instructions for enabling the validation the logic design by comparing an infinite behavior represented by a strongly connected component to an expected behavior of the logic design.

22. The computer system of claim 21 wherein the instructions for recursively decomposing further comprise:

instructions for determining a backward set for the node; and instructions for finding all non-trivial strongly connected components in the backward set.

23. The computer system of claim 21 wherein the instructions for recursively decomposing further comprise:

instructions for determining a forward set for a node in the STG; and instructions for finding all non-trivial strongly connected components in the forward set.

24. The computer system of claim 21 wherein the instructions for recursively decomposing further comprise instructions for interleaved determination of forward and backward sets.

25. A programmed computer system enabled to verify a design for at least a portion of a logic system by performing a method comprising:

deriving a state transition graph (STG) for the design, the STG comprising a plurality of nodes representing values of state variables in the logic system, and a plurality of edges between nodes describing state transitions;

recursively decomposing the STG to determine all non-trivial strongly connected components of the STG; and for at least one non-trivial strongly connected component (SCC), determining when the non-trivial SCC represents a bad cycle indicating a problem with the design.

26. The computer system of claim 25 wherein determining when the non-trivial SCC represents a bad cycle is accomplished by determining when the non-trivial SCC is not in any cycle set.

27. The computer system of claim 25 wherein determining when the non-trivial SCC represents a bad cycle is accomplished by determining when the non-trivial SCC intersects compliment sets of all cycle sets.

28. A method of verifying a design for at least a portion of a logic system, the method comprising:

deriving a state transition graph (STG) for the design;

determining at least one of a backward set and a forward set for each node in the STG;

finding all non-trivial strongly connected components in the at least one of a backward set and a forward set for each node in the STG; and comparing an infinite behavior represented by each strongly connected component to an expected behavior of the design to validate the design.

29. The method of claim 28 wherein the at least one of a backward set and a forward set comprises an interleaved determination of forward and backward sets.

30. A computer program product including a computer usable medium having a computer program embodied thereon, the computer program for verifying a logical system, the computer program comprising:

instructions for partitioning the logical system into a plurality of logic designs;

instructions for deriving a state transition graph (STG) for a logic design;

instructions for recursively decomposing the STG to determine all non-trivial strongly connected components of the STG; and instructions for enabling the validation the logic design by comparing an infinite behavior represented by a strongly connected component to an expected behavior of the logic design.

31. The computer program product of claim 30 wherein the instructions for recursively decomposing further comprise:

instructions for determining a backward set for a node in the STG; and instructions for finding all non-trivial strongly connected components in the backward set.

32. The computer program product of claim 30 wherein the instructions for recursively decomposing further comprise:

instructions for determining a backward set for a node in the STG; and instructions for finding all non-trivial strongly connected components in the backward set.

33. The computer program product of claim 30 wherein the instructions for recursively decomposing further comprise instructions for interleaved determination of forward and backward sets.

34. A computer system enabled to verify a design for at least a portion of a logic system, the computer system comprising at least one processor executing a computer program further comprising:

instructions for deriving a state transition graph (STG) for the logic design;

instructions for determining at least one of a backward set and a forward set for each node in the STG;

instructions for finding all non-trivial strongly connected components in the at least one of a backward set and a forward set for each node in the STG; and instructions for enabling the validation the logic design by comparing an infinite behavior represented by a strongly connected component to an expected behavior of the logic design.

35. The computer system of claim 34 wherein the instructions for determining at least one of a backward set and a forward set comprise instructions for interleaved determination of forward and backward sets.

* * * * *